United States Patent
Lee et al.

(10) Patent No.: US 7,170,801 B2
(45) Date of Patent: Jan. 30, 2007

(54) METHOD FOR REPLACING DEFECTS IN A MEMORY AND APPARATUS THEREOF

(75) Inventors: Sang-su Lee, Seoul (KR); Young-joo Seo, Suwon-si (KR); Se-woong Park, Suwon-si (KR); Yoon-nam Lee, Suwon-si (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 177 days.

(21) Appl. No.: 10/612,300

(22) Filed: Jul. 3, 2003

(65) Prior Publication Data
US 2004/0125666 A1 Jul. 1, 2004

(30) Foreign Application Priority Data
Jul. 4, 2002 (KR) .................. 10-2002-0038658

(51) Int. Cl.
*G11C 29/00* (2006.01)
(52) U.S. Cl. ................... 365/200; 365/201
(58) Field of Classification Search ........... 365/200, 365/201, 210, 189.07
See application file for complete search history.

(56) References Cited

U.S. PATENT DOCUMENTS

| | | | | |
|---|---|---|---|---|
| 4,475,194 A | * | 10/1984 | LaVallee et al. | 371/10 |
| 4,654,847 A | * | 3/1987 | Dutton | 371/10 |
| 4,942,556 A | * | 7/1990 | Sasaki et al. | 365/200 |
| 5,987,635 A | * | 11/1999 | Kishi et al. | 714/724 |
| 6,097,644 A | * | 8/2000 | Shirley | 365/200 |
| 6,119,251 A | * | 9/2000 | Cloud et al. | 714/718 |
| 6,295,237 B1 | * | 9/2001 | Pochmuller | 365/201 |
| 6,421,283 B1 | * | 7/2002 | Walley et al. | 365/200 |
| 6,731,550 B2 | * | 5/2004 | McClure | 365/200 |
| 6,825,682 B2 | * | 11/2004 | Kantz et al. | 324/763 |
| 6,914,846 B2 | * | 7/2005 | Harari et al. | 365/230.03 |

FOREIGN PATENT DOCUMENTS

JP 2000-305858 A 11/2000

* cited by examiner

*Primary Examiner*—Son L. Mai
(74) *Attorney, Agent, or Firm*—Sughrue Mion, PLLC

(57) ABSTRACT

A method and an apparatus for restoring defective memory cells are provided. The apparatus includes memory, a memory scan controller, which scans the memory to see if the memory is defective when a system starts operating and transmits resulting defect information to a memory controller, and the memory controller, which converts an external address applied from a system controller into an internal address for accessing the memory and replaces a defective cell in the memory with spare memory provided therein so that when a request for access to the defective cell is issued by the system controller, spare memory, rather than the defective cell, can be accessed by the system controller.

25 Claims, 3 Drawing Sheets

METHOD FOR REPLACING DEFECTS IN A MEMORY AND APPARATUS THEREOF

BACKGROUND OF THE INVENTION

This application claims the priority of Korean Patent Application No. 2002-38658, filed on Jul. 4, 2002, in the Korean Intellectual Property Office, the disclosure of which is incorporated herein in its entirety by reference.

1. Field of the Invention

The present invention relates to a method, an apparatus, and a computer-readable medium for restoring defective memory cells. More specifically, the present invention scans the memory to see whether the memory is defective when a system starts operating and when needed, replaces a defective cell in the memory with spare memory provided therein so that spare memory rather than the defective cell, can be accessed.

2. Description of the Related Art

Recently, in accordance with the digitalization of electronic devices, the use of memory as storage media has been increasing. However, each memory cell may be damaged by dust or crystal defects so that data can no longer be written to or read from it. As the storage capacity of memory increases, the rate of defective memory cells is more likely to increase.

When writing data to or reading data from a defective memory cell, an error can occur, possibly resulting in important data loss or a system malfunction. Accordingly, when memory has defective cells, non-defective new cells are needed to replace the defective ones. This process results in wasted time and money.

Therefore, there is an unmet need in the related art to restore defective memory cells in a system that uses a memory as a storage medium.

SUMMARY OF THE INVENTION

The present invention provides a method of restoring defective memory cells.

The present invention also provides an apparatus for restoring defective memory cells.

The present invention also provides a computer-readable medium having a stored memory cell program for restoring defective memory cells, executed by a computer.

The present invention also provides a memory controller replacing defective memory cells with non-defective spare memory.

In an embodiment of the present invention, a method is provided for restoring defective memory cells. The method includes (a) checking all cells of memory to determine if the memory is defective or not when a system starts operating, (b) storing defect information, obtained as a result of the checking, in a memory controller when the checking of the memory is over, and (c) replacing defective cells in the memory with spare memory provided in the memory controller when there is a request for access to the defective cells.

In a preferred embodiment of the present invention, the method further includes issuing a request for replacing the memory with new memory when the number of defective cells in the memory exceeds a predetermined number.

According to another aspect of the present invention, there is provided an apparatus for restoring defective memory cells. The apparatus includes (1) memory, (2) a memory scan controller, which scans the memory to see if the memory is defective when a system starts operating and transmits resulting defect information to a memory controller, and (3) the memory controller, which converts an external address applied from a system controller into an internal address for accessing the memory and replaces a defective cell in the memory with spare memory provided therein so that when a request for access to the defective cell is issued by the system controller, spare memory, rather than the defective cell, can be accessed by the system controller.

In a preferred embodiment of the apparatus, the memory scan controller generates a memory replacement signal when a number of defective cells in the memory exceeds a predetermined number.

Also in a preferred embodiment of the apparatus, the memory controller includes data registers which store (1) external addresses corresponding to defective cells, (2) comparators which compare each of the external addresses stored in the data registers with the external address applied by the system controller, (3) data registers which are activated depending on a comparison result, (4) a match detector which detects if an external address that matches the external address applied by the system controller exists among the external addresses stored in the data registers by referring to the comparison result, (5) a multiplexer which controls a data path to the data registers or to the memory depending on a detection result of the match detector, and (6) a controller which loads the external addresses of the defective cells into the data registers by referring to the defect information and replaces the defective cells in the memory with the data registers, depending on the detection result of the match detector, so that the data registers can be accessed instead of the defective cells.

Also in a preferred embodiment of the apparatus, the apparatus further includes a delayer which delays an internal address and a control signal, before the internal address and the control signal are applied to the memory, and when a request is issued for a defective cell in the memory, so that the defective cell and its corresponding replacement data register are prevented from competing with each other in regard to memory access.

According to still another embodiment of the present invention, there is provided a memory controller for converting an external address, applied by a system controller, into an internal address necessary to access memory. The memory controller includes (1) data registers which store external addresses corresponding to defective cells, (2) comparators which compare each of the external addresses stored in the data registers with the external address applied by the system controller, (3) data registers which are activated depending on a comparison result, (4) a match detector which detects if an external address that matches the external address applied by the system controller exists among the external addresses stored in the data registers by referring to the comparison result, (5) a multiplexer which controls a data path to the data registers or to the memory depending on a detection result of the match detector, and (6) a controller which loads the external addresses of the defective cells into the data registers by referring to defect information and replaces the defective cells in the memory with the data registers, depending on the detection result of the match detector, so that the data registers can be accessed instead of the defective cells.

According to another aspect of the present invention, a stored memory cell program for restoring defective memory cells can be implemented in software, but is not limited to computer-readable medium. The computer-readable medium is provided to (1) scan memory to see if the memory is defective when a system starts operating, (2) store defect information resulting from the scan in a memory controller, and (3) replace defective cells in the memory with spare memory provided therein so that spare memory, rather than the defective cell, can be accessed by the system controller.

In a preferable embodiment of the present invention, the memory controller further includes a delayer which delays an internal address and a control signal before the internal address and the control signal are applied to the memory and when a request is issued for a defective cell in the memory, so that the defective cell and its corresponding replacement data register are prevented from competing with each other in regard to memory access.

BRIEF DESCRIPTION OF THE DRAWINGS

The features and advantages of the present invention will become more apparent through the detailed description of preferred embodiments based on the accompanying drawings in which.

DETAILED DESCRIPTION OF THE INVENTION

Hereinafter, the present invention will be described in greater detail with reference to the accompanying drawings, in which preferred embodiments of the present invention are shown.

Figure 1:
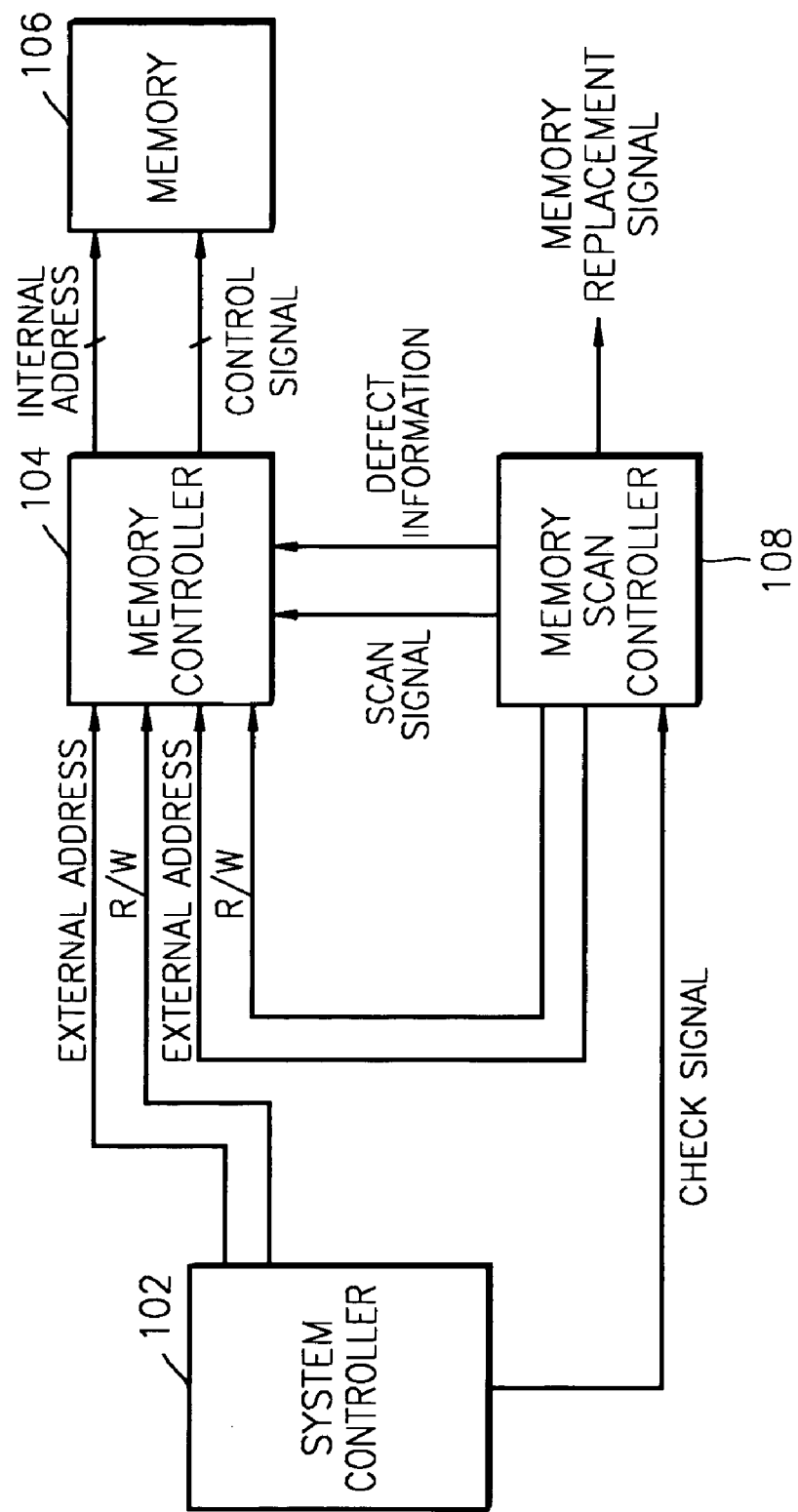
FIG. 1 is a block diagram of an apparatus for restoring defective memory cells according to an exemplary, non-limiting embodiment of the present invention.

FIG. 1 is a block diagram of an apparatus for restoring defective memory cells according to an exemplary, non-limiting embodiment of the present invention. The apparatus for restoring defective memory cells includes a system controller 102, which controls a system, a memory controller 104, which controls memory access, memory 106, and a memory scan controller 108.

Memory 106 is accessed using an external address. When reading data from memory 106, the system controller 102 applies an external address and a read control signal to the memory controller 104, and reads data across a data bus (not shown) from memory 106.

Conversely, when writing data to memory 106, the system controller 102 applies the external address and a write control signal to the memory controller 104, and writes data across the data bus (not shown) to memory 106.

The memory controller 104 generates an internal address, corresponding to the external address and designating the memory cell to be accessed, and control signals row access strobe RAS, column access strobe CAS, and write enable WE for controlling data read and write operations. The memory controller 104 applies the internal address and the control signals RAS, CAS and WE to memory 106.

The correlation between the external address applied by the system controller 102 and the internal address necessary to access memory 106 varies depending on the type and structure of memory 106. Therefore, the memory controller 104 is provided for appropriate conversions between external and internal addresses.

In particular, the memory controller 104 transforms the memory access requests made by the system controller 102, depending on the type and structure of memory 106. The memory controller 104 allows the system controller 102 to access memory of any kind or any structure.

When the system illustrated in FIG. 1 operates, the memory scan controller 108 scans the memory 106 for any defective cells and provides the resulting defect information to the memory controller 104. The defect information includes but is not limited to, the external addresses of defective cells in memory 106. The memory controller 104 includes but is not limited to, spare memory (e.g., internal registers) which are provided to replace defective cells in memory 106. When the system controller 102 accesses defective cells in memory 106, the memory controller 104 writes data to or reads data from the spare memory, rather than the defective cells in memory 106.

When, according to the present invention, the apparatus for restoring defective memory cells shown in FIG. 1 operates, the memory scan controller 108 scans memory 106 for any defective memory cells by writing predetermined data to memory 106, reading back the predetermined data from memory 106, and then comparing the data written to memory 106 with the data read from memory 106. This process requires that the memory scan controller 108 generates an external address and read/write control signals R/W, and applies the external address and the read/write control signals R/W to the memory controller 104.

A check signal CHECK SIGNAL is provided to the memory scan controller 108 from the system controller 102 to initiate a memory scan operation in the memory scan controller 108. In response to the check signal CHECK SIGNAL, the memory scan controller 108 performs the memory scan operation.

While performing a memory scan operation, the memory scan controller 108 applies a scan signal SCAN SIGNAL to the memory controller 104 so that the system controller 102 is prevented from accessing memory 106. When the scan signal SCAN SIGNAL is activated, the memory controller 104 operates only in response to the external address and the read/write control signals R/W applied from the memory scan controller 108. When the scan signal SCAN SIGNAL is deactivated, the memory controller 104 operates in response to the external address and the read/write control signals applied from the system controller 102.

As a result of the memory scan operation, the memory scan controller 108 obtains the external addresses of defective cells in memory 106. After the memory scan operation, the external addresses of the defective cells of the memory 106 are transmitted to the memory controller 104 as the defect information.

The defective cells, identified by the defect information that is provided by the memory scan controller 108 to the memory controller 104, are in the form of external addresses. This address format is substantially similar to the format used by the system controller 102, rather than the internal address format applied from the memory controller 104.

The defect information is stored in the memory controller 104. Using the defect information, the memory controller 104 matches the external addresses of the defective cells in memory 106 with spare memory such that the defective cells are replaced by corresponding spare cells. Therefore, any request for access to defective cells can be met by accessing corresponding spare memories in the memory controller 104.

Figure 2:
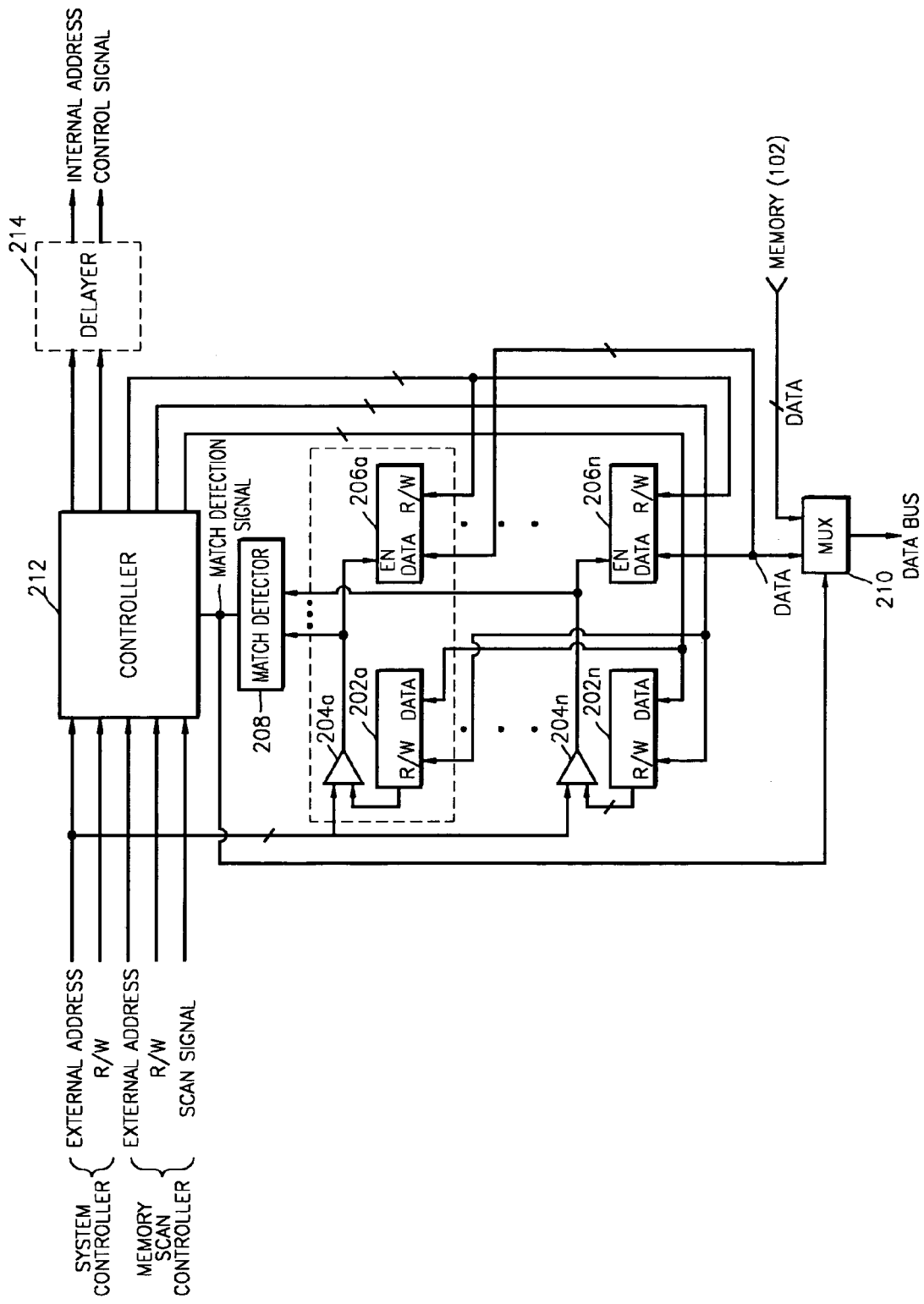
FIG. 2 is a block diagram of the memory controller shown in FIG. 1, according to an exemplary, non-limiting embodiment of the present invention.

FIG. 2 is a block diagram of the memory controller 104 shown in FIG. 1. The memory controller 104 includes first data registers 202a through 202n, which store the external addresses of defective cells in memory 106, comparators 204a through 204n which compare the external addresses applied from the system controller 102 with the external addresses stored in the first data registers 202a through 202n, second data registers 206a through 206n which are activated depending on the results of the comparisons performed by the comparators 204a through 204n, a match detector 208 which uses the results of the comparisons and detects if the external address applied by the system controller 102 matches any external address of defective cells in memory 106, a multiplexer 210 which controls data paths leading to memory 106 and to the data registers 206a through 206n, and a controller 212 which controls the operation of the memory controller 104. The first and second data registers 202a through 202n and 206a through 206n correspond to the spare memory disclosed above.

The controller 212 provides the basic functionality of the memory controller 104. The controller 212 converts the external address applied by the system controller 102 into an internal address necessary to access memory 106. When the scan signal SCAN SIGNAL is activated, and the external addresses and the read/write control signal are applied by the memory scan controller 108, the controller 212 generates internal addresses and the control signals necessary to access memory 106. In addition, in order to replace the defective cells in the memory 106 with the spare memories (i.e., the data registers 206a through 206n) the controller 212 receives the defect information after the memory scan operation is completed, stores the external addresses of the defective cells in the first data registers 202a through 202n, and accesses the second data registers 206a through 206n when a match signal is generated from the match detector 208.

The controller 212 receives external addresses either from the system controller 102 or from the memory scan controller 108. The scan signal SCAN SIGNAL determines whether the controller 212 will use the external addresses applied by the system controller 102 or the external addresses applied by the memory scan controller 108.

After the memory scan operation is complete, the memory controller 104 receives information on the external addresses of the defective cells from the memory scan controller 108. Completion of the memory scan operation can be determined by checking for deactivation of the scan signal SCAN SIGNAL.

The controller 212 stores the defect information and loads the external addresses of the defective cells into the first data registers 202a through 202n. More specifically, the controller 212 generates data register load signals and sequentially loads the external addresses of the defective cells into their corresponding first data registers 202a through 202n.

The comparators 204a through 204n compare the external addresses stored in the first data registers 202a through 202n with the external addresses applied by the system controller 102. The results of the comparisons indicate whether or not the system controller 102 is attempting to access defective cells in memory 106. For data registers where external addresses of defective cells have not been loaded, the corresponding comparators are inactive.

The first data registers 202a through 202n operate in line with the comparators 204a through 204n, respectively, and the second data registers 206a through 206n, respectively. In particular, when comparators determine that external addresses stored therein are the same as external addresses applied by the system controller 102, only the data registers corresponding to the respective comparators are activated. Data that is intended to be written to and read from defective cells in memory 106 is actually written to or read from the corresponding active data registers of the memory controller 104.

The match detector 208 detects whether or not any of the comparison results from comparators 204a through 204n indicate that an external address stored therein matches an external address applied by the system controller 102. A match detection signal generated by the match detector 208 indicates the address requested by the system controller 102 contains the defective cells in memory 106.

In response to the match detection signal, the controller 212 generates a data register read/write control signal DR R/W so that second data registers 206a through 206n, rather than memory 106, can be accessed.

In response to the match detection signal, the multiplexer 210 controls data paths leading to memory 106 and to second data registers 206a through 206n.

The controller 212 generates internal addresses in response to the input of external addresses. Therefore, in the case of accessing defective cells in memory 106, the controller 212 makes it possible to access memory 106 instead of the second data registers 206a through 206n. In order for the second data registers 206a through 206n to gain access priority over memory 106, the operation speed of the comparators 204a through 204n, the match detector 208, and the multiplexer 210 must be faster than the speed of the controller 212, which generates the internal addresses. Alternatively, a delayer 214 that delays the internal address and the control signal applied to memory 106 may be further provided in the memory controller 104 shown in FIG. 2.

Figure 3:
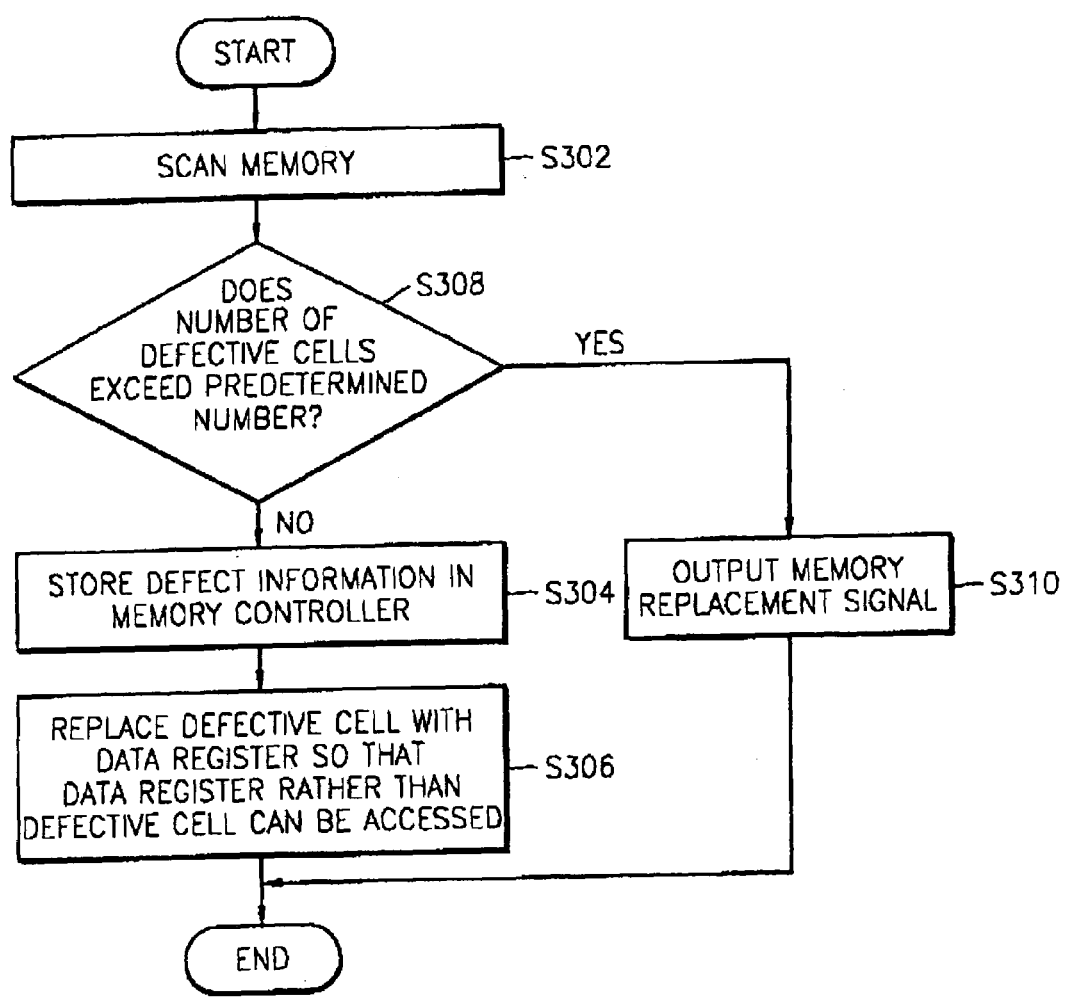
FIG. 3 is a flowchart of the operation of the apparatus for restoring defective memory cells shown in FIG. 1 according to an exemplary, non-limiting embodiment of the present invention, which follows a method of restoring defective memory cells according to a preferred embodiment of the present invention.

It is preferable to impose a restriction on the number of second data registers 206a through 206n provided in the memory controller 104. In a preferred embodiment of the present invention, the second data registers 206a through 206n account for up to about 0.1% of the storage capacity in memory 106. If the number of defective cells exceeds the number of data registers 206a through 206n, the memory scan controller 108 generates a memory replacement signal indicating that memory 106 needs to be replaced. FIG. 3 is a flowchart of the operation of the apparatus for restoring defective memory cells shown in FIG. 1, which adopts a method of restoring defective memory cells according to an exemplary, non-limiting embodiment of the present invention. When the entire system starts to operate, the memory scan controller 108 is used to check for any defective cells in memory, as shown in step S302.

In step S302, the system controller 102 applies the check signal CHECK SIGNAL to the memory scan controller 108. The memory scan controller 108 then checks memory 106 in response to the check signal CHECK SIGNAL, and obtains the defect information as a result of a scanning.

A method of checking the state of all cells of memory 106 using the memory scan controller 108 is as follows. First, a data value "1" is written on each cell of memory 106, and then a data read operation is performed on each cell of memory 106 to verify consistency of the data value "1". For cells in which the data value of "1" has not been read correctly, the corresponding external addresses are stored in the memory controller 104.

Next, a data value of "0" is written on each cell of memory 106, and then a data read operation is performed on each cell of memory 106 to verify consistency of the data value "0". For cells in which the data value of "0" has not been read correctly, the corresponding external addresses are stored in the memory controller 104.

In order to check if a short circuit exists between adjacent cells of memory 106, "1" and "0" are alternately written on the cells of memory 106, so that adjacent cells have different data values. Then, a data read operation is performed on each cell of memory 106 to verify consistency of the data values. Thereafter, for cells in which either "1" or "0" has not been read correctly, the corresponding external addresses are stored in the memory controller 104.

Finally, "0" and "1", rather than "1" and "0", are alternately written on the cells of memory 106 so that adjacent cells have different data values, and then a data read operation is performed on each cell of memory 106 to verify consistency of the data values. Thereafter, for cells in which either "0" or "1" has not been read correctly, the corresponding external addresses are stored in the memory controller 104.

When the process of checking memory 106 at step S302 is over, in step S308, if the number of defective cells in memory 106 exceeds a predetermined number, the memory scan controller 108 outputs the memory replacement signal in step S310. When it has been determined that the number of cells does not exceed a predetermined number in step S308, the defect information is stored in the memory controller in step S304.

At step S306, when an access request is made to a defective cell in memory 106, the defective cell is replaced by spare memory provided in the memory controller 104. Spare memory, rather than the defective cell, can then be accessed, as represented.

The memory controller 104 accesses memory 106 referring to external address information provided by the memory scan controller 108. In particular, the controller 212 in the memory controller 104 loads the external addresses of defective cells into the first data registers 202*a* through 202*n*. The external addresses of defective cells are specified in the defect information provided by the memory scan controller 108. When the match detector 208 generates a match signal, the controller 212 accesses the second data registers 206*a* through 206*n* instead of memory 106.

The present invention can be implemented in software, but not limited to a computer-readable medium, and provides a stored memory cell program for restoring defective memory cells. When a system starts operating, the computer-readable medium scans the memory to see if the memory is defective. It then stores defect information resulting from the scan in a memory controller, and replaces defective cells in the memory with spare memory, provided therein. When a request for access to the defective cell is issued then by the system controller, spare memory, rather than the defective cell, can be accessed by the system controller.

The present invention has various advantages. For example, according to the apparatus for restoring defective memory cells, an exemplary, non-limiting embodiment of the present invention, it is possible to instantly determine whether memory has any defects by checking whether defective cells exist in memory as soon as the system starts to operate.

In addition, the costs associated with replacing memory containing defective cells can be reduced by replacing the defective cells with registers in a memory controller.

Furthermore, when the number of defective cells in memory exceeds the number of registers provided in a memory controller, the memory can be replaced with a new one. Therefore, it is possible to reliably use memory.

What is claimed is:

1. A method of restoring defective memory cells, comprising:
   (a) checking all cells of a memory to determine whether the memory is defective at an operation start time;
   (b) storing defect information, obtained as a result of the checking, in a memory controller when the checking of all of the cells of the memory is over; and
   (c) replacing defective cells in the memory with spare memory provided in the memory controller when there is a request for access to the defective cells of the memory,
   wherein said memory controller and said memory are separate elements.

2. The method of claim 1, further comprising generating a request for replacing the memory with a new memory when a number of the defective cells in the memory exceeds a predetermined number of data registers.

3. An apparatus for restoring defective memory cells, comprising:
   a memory scan controller, which scans a memory in response to a control signal to determine whether at least one cell of the memory is defective at an operation start time and generates defect information; and
   a memory controller, which receives the defect information and converts a requested external address into an internal address for accessing the memory, and replaces said at least one defective cell in the memory with spare memory provided in said memory controller, wherein spare memory, rather than the defective cell, is accessed by a system controller when the requested external address corresponds to the defective cell.

4. The apparatus of claim 3, wherein the memory scan controller generates a memory replacement signal when a number of said defective cells in the memory exceeds a predetermined number of data registers.

5. The apparatus of claim 3, wherein the memory controller comprises:
   first data registers which store external addresses corresponding to said at least one defective cell in the memory;
   comparators which compare each of the external addresses stored in the first data registers with the external address applied by the system controller;
   second data registers which are activated depending on a comparison result;
   a match detector which detects if an external address that matches the external address applied by the system controller exists among the external addresses stored in the first data registers by referring to the comparison result;
   a multiplexer which controls a data path to the second data registers or to the memory depending on a detection result of the match detector; and
   a controller which loads the external addresses of said at least one defective cell in the memory into the first data registers by referring to the defect information and replaces said at least one defective cell in the memory with the second data registers, depending on the detection result of the match detector, so that the second data registers can be accessed instead of the defective cell.

6. The apparatus of claim 5, further comprising a delayer which delays an internal address and a control signal before the internal address and the control signal are applied to the memory and when a request is issued for a defective cell in the memory, so that the defective cell and its corresponding replacement second data register are prevented from competing with each other in regard to memory access.

7. A memory controller for converting an external address applied by a system controller into an internal address necessary to access memory, the memory controller comprising:
- first data registers which store external addresses corresponding to at least one defective cell in a memory;
- comparators which compare each of the external addresses stored in the first data registers with the external address applied by the system controller;
- second data registers which are activated depending on a comparison result;
- a match detector which detects if an external address that matches the external address applied by the system controller exists among the external addresses stored in the first data registers by referring to the comparison result;
- a multiplexer which controls a data path to the second data registers or to the memory depending on a detection result of the match detector; and
- a controller which loads the external addresses of said at least one defective cell in the memory into the first data registers by referring to defect information and replaces said at least one defective cell in the memory with the second data registers, depending on the detection result of the match detector, so that the second data registers can be accessed instead of the defective cell.

8. The memory controller of claim 7 further comprising a delayer which delays an internal address and a control signal before the internal address and the control signal are applied to the memory and when a request is issued for a defective cell in the memory, so that the defective cell and its corresponding replacement second data register are prevented from competing with each other in regard to memory access.

9. The apparatus of claim 7, wherein the number of said second data registers is restricted to 0.1% of a storage capacity of the memory.

10. The apparatus of claim 7, wherein an operation speed of the comparator, the match detector, and the multiplexer is faster than a speed of the controller.

11. A method of restoring defective memory cells, comprising:
- (a) checking all cells of a memory to determine whether the memory is defective at an operation start time;
- (b) storing defect information, obtained as a result of the checking, in a memory controller when the checking of all of the cells of the memory is over; and
- (c) replacing defective cells in the memory with spare memory provided in the memory controller when there is a request for access to the defective cells of the memory, wherein checking is determined complete by scanning for deactivation of a scan signal.

12. A method of restoring defective memory cells, comprising:
- (a) checking all cells of a memory to determine whether the memory is defective at an operation start time;
- (b) storing defect information, obtained as a result of the checking, in a memory controller when the checking of all of the cells of the memory is over; and
- (c) replacing defective cells in the memory with spare memory provided in the memory controller when there is a request for access to the defective cells of the memory, wherein the memory controller comprises:
- first data registers which store external addresses corresponding to said at least one defective cell in the memory;
- comparators which compare each of the external addresses stored in the first data registers with the external address applied by the system controller;
- second data registers which are activated depending on a comparison result;
- a match detector which detects if an external address that matches the external address applied by the system controller exists among the external addresses stored in the first data registers by referring to the comparison result;
- a multiplexer which controls a data path to the second data registers or to the memory depending on a detection result of the match detector; and
- a controller which loads the external addresses of said at least one defective cell in the memory into the first data registers by referring to the defect information and replaces said at least one defective cell in the memory with the second data registers, depending on the detection result of the match detector, so that the second data registers can be accessed instead of the defective cell.

13. The method of claim 12, wherein the number of said second data registers is restricted to 0.1% of a storage capacity of the memory.

14. The method of claim 12 wherein an operation speed of the comparator, the match detector, and the multiplexer is faster than an operation speed of the controller.

15. The apparatus of claim 5 wherein the number of said second data registers is restricted to 0.1% of a storage capacity of the memory.

16. The apparatus of claim 5 wherein an operation speed of the comparator, the match detector, and the multiplexer is faster than an operation speed of the controller.

17. A method of restoring defective memory cells, comprising:
- (a) checking all cells of a memory to determine whether the memory is defective at an operation start time;
- (b) storing defect information, obtained as a result of the checking, in a memory controller when the checking of all of the cells of the memory is over; and
- (c) replacing defective cells in the memory with spare memory provided in the memory controller when there is a request for access to the defective cells of the memory, said method further comprising delaying an internal address and a control signal before the internal address and the control signal are applied to the memory and when a request is issued for a defective cell in the memory, so that the defective cell and its corresponding replacement second data register are prevented from competing with each other in regard to memory access.

18. A computer-readable medium configured to store a set of instructions for restoring defective memory cells, said instructions comprising:
- checking all cells of a memory to determine whether the memory is defective at an operation start time;
- storing defect information, obtained as a result of the check, in a memory controller, when a checking of all of the cells of the memory is over; and
- replacing defective cells in the memory with spare memory provided in the memory controller when there is a request for access to the defective cells of the memory, wherein said memory controller and said memory are separate elements.

19. The computer-readable medium according to claim 18, further comprising: generating a request for replacing the memory with a new memory when a number of the defective cells in the memory exceeds a number of data registers.

20. A computer-readable medium configured to store a set of instructions for restoring defective memory cells, said instructions comprising:
checking all cells of a memory to determine whether the memory is defective at an operation start time;
storing defect information, obtained as a result of the check, in a memory controller, when a checking of all of the cells of the memory is over; and
replacing defective cells in the memory with spare memory provided in the memory controller when there is a request for access to the defective cells of the memory,
wherein completion of the checking is determined by scanning for deactivation of a scan signal.

21. A computer-readable medium configured to store a set of instructions for restoring defective memory cells, said instructions comprising:
checking all cells of a memory to determine whether the memory is defective at an operation start time;
storing defect information, obtained as a result of the check, in a memory controller, when a checking of all of the cells of the memory is over; and
replacing defective cells in the memory with spare memory provided in the memory controller when there is a request for access to the defective cells of the memory,
wherein said set of instructions further comprises:
storing external addresses in first data registers corresponding to said at least one defective cell in a memory;
comparing each of the external addresses stored in the first data registers with the external address applied by the system controller;
activating second data registers depending on a comparison result;
detecting if an external address that matches the external address applied by the system controller exists among the external addresses stored in the first data registers by referring to the comparison result;
controlling a data path to the second data registers or to the memory depending on a detection result of the match detector; and
loading the external addresses of said at least one defective cell in the memory into the first data registers by referring to the defect information and replacing said at least one defective cell in the memory with the second data registers, depending on the detection result of the match detector, so that the data registers can be accessed instead of the defective cell.

22. The computer-readable medium of claim 21, wherein the number of said second data registers is restricted to 0.1% of a storage capacity of the memory.

23. The computer-readable medium of claim 21, wherein the comparing, detecting, and controlling instructions operate with a speed faster than the loading instruction.

24. The computer-readable medium of claim 21, wherein said set of instructions further comprises:
delaying an internal address and a control signal before the internal address and the control signal are applied to the memory and when a request is issued for a defective cell in the memory, so that the defective cell and its corresponding second replacement data register are prevented from competing with each other in regard to memory access.

25. A method of restoring defective memory cells, comprising:
(a) checking all cells of a memory to determine whether the memory is defective at an operation start time;
(b) storing defect information, obtained as a result of the checking, in a memory controller when the checking of all of the cells of the memory is over; and
(c) replacing defective cells in the memory with spare memory provided in the memory controller when there is a request for access to the defective cells of the memory,
wherein said spare memory is not coupled with said memory.

* * * * *